(12) United States Patent  
Shyvers

(10) Patent No.: US 12,009,047 B2
(45) Date of Patent: Jun. 11, 2024

(54) SYSTEMS AND METHODS FOR CONTINUOUS WORDLINE MONITORING

(71) Applicant: Advanced Micro Devices, Inc., Santa Clara, CA (US)

(72) Inventor: Patrick James Shyvers, Fort Collins, CO (US)

(73) Assignee: Advanced Micro Devices, Inc., Santa Clara, CA (US)

(*) Notice: Subject to any disclaimer, the term of this patent is extended or adjusted under 35 U.S.C. 154(b) by 20 days.

(21) Appl. No.: 17/957,498

(22) Filed: Sep. 30, 2022

(65) Prior Publication Data

US 2024/0112749 A1    Apr. 4, 2024

(51) Int. Cl.
*G11C 29/52* (2006.01)
*G06F 11/07* (2006.01)
*G06F 11/10* (2006.01)
*G11C 29/10* (2006.01)

(52) U.S. Cl.
CPC .......... *G11C 29/52* (2013.01); *G06F 11/0772* (2013.01); *G06F 11/0793* (2013.01); *G06F 11/1064* (2013.01); *G11C 29/10* (2013.01)

(58) Field of Classification Search
CPC ............ G06F 11/1064; G06F 11/0772; G06F 11/0793; G11C 29/52
See application file for complete search history.

(56) References Cited

U.S. PATENT DOCUMENTS

| | | | | |
|---|---|---|---|---|
| 6,807,107 B1* | 10/2004 | McGee | ................ | G11C 11/412 |
| | | | | 365/189.08 |
| 8,397,130 B2* | 3/2013 | Clark | ................ | G06F 11/1407 |
| | | | | 714/763 |
| 2003/0218925 A1* | 11/2003 | Torjussen | ................ | G06F 11/08 |
| | | | | 365/200 |
| 2010/0083037 A1* | 4/2010 | Oberlaender | ...... | G11C 29/4401 |
| | | | | 714/5.1 |
| 2013/0036276 A1 | 2/2013 | Radovic | | |
| 2014/0136915 A1 | 5/2014 | Hyde | | |
| 2015/0248249 A1 | 9/2015 | Amidi | | |
| 2018/0232159 A1 | 8/2018 | Lin | | |
| 2020/0310683 A1* | 10/2020 | Costa | ................ | G06F 11/1004 |
| 2021/0042188 A1 | 2/2021 | Chen | | |

OTHER PUBLICATIONS

S. Wang and L. Wang, "Exploiting Memory Soft Redundancy for Joint Improvement of Error Tolerance and Access Efficiency," in IEEE Transactions on Very Large Scale Integration (VLSI) Systems, vol. 17, No. 8, pp. 973-982, Aug. 2009, (Year: 2009).*

International Search Report and Written Opinion dated Jan. 23, 2024, for International Application No. PCT/US2023/075461; 9 pages.

* cited by examiner

*Primary Examiner* — Cynthia Britt
(74) *Attorney, Agent, or Firm* — Greenberg Traurig, LLP

(57) ABSTRACT

The disclosed computing device includes a cache memory and at least one processor coupled to the cache memory. The at least one processor is configured to copy data written to one or more nonredundant wordlines of the cache memory to one or more redundant wordlines of the cache memory. The at least one processor is additionally configured to detect a mismatch between data read from the one or more nonredundant wordlines and data stored in the one or more redundant wordlines. The at least one processor is also configured to perform a remediation action in response to detecting the mismatch. Various other methods, systems, and computer-readable media are also disclosed.

20 Claims, 11 Drawing Sheets

SYSTEMS AND METHODS FOR CONTINUOUS WORDLINE MONITORING

BACKGROUND

Error detection for large memory arrays (e.g., static random access memory (SRAM), dynamic random access memory (DRAM), etc.) depend on error correcting codes (ECC) and/or memory built-in self test (BIST). However, ECC is not a reliable detector for more than two or three bit flips, depending on the code used. Also, memory BIST is effective at discovering faults, but destroys the state in the memory, so it is typically only performed during system boot. Some high reliability systems with multiple processors are capable of taking select memory offline and running memory BIST while the rest of the system remains online, but this capability is accompanied by the costs of a performance impact and a high level of implementation complexity.

BRIEF DESCRIPTION OF THE DRAWINGS

The accompanying drawings illustrate a number of example embodiments and are a part of the specification. Together with the following description, these drawings demonstrate and explain various principles of the present disclosure.

Figure 1:
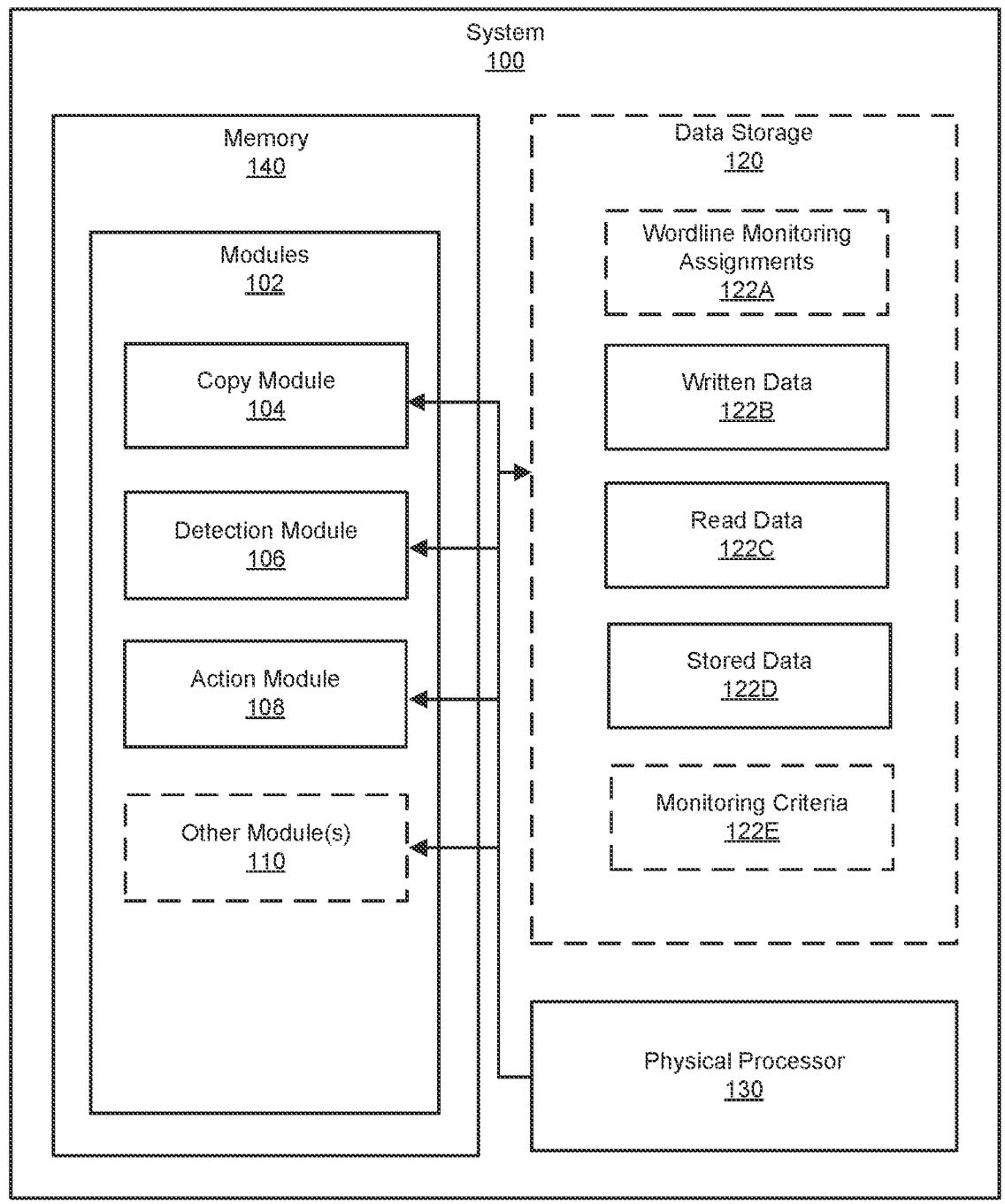
FIG. 1 is a block diagram of an example system for continuous wordline monitoring.

Throughout the drawings, identical reference characters and descriptions indicate similar, but not necessarily identical, elements. While the example embodiments described herein are susceptible to various modifications and alternative forms, specific embodiments have been shown by way of example in the drawings and will be described in detail herein. However, the example embodiments described herein are not intended to be limited to the particular forms disclosed. Rather, the present disclosure covers all modifications, equivalents, and alternatives falling within the scope of the appended claims.

DETAILED DESCRIPTION OF EXAMPLE EMBODIMENTS

The present disclosure is generally directed to systems and methods for continuous wordline monitoring. Large memory arrays (e.g., SRAM, DRAM, etc.) sometimes develop wordline faults in the field that often masquerade as correctable errors and avoid detection, introducing data corruption. Wordline failure in a live system is often difficult to detect. Partial failure often looks like correctable ECC events, or is completely invisible, while total failure could result in reading data from the previous access, which would be clean and correct data but belonging to a different address. It is difficult to detect these faults without knowing what the correct data should be. However, these arrays are also prime targets for "wordline repair" features—redundant elements designed to repair around a faulty wordline. These redundant elements are frequently unused.

The systems and methods disclosed herein leverage one or more unused redundant elements to record data observed to be written to one or more nonredundant wordlines. When reads to a nonredundant wordline are observed, the redundant element is also read, and the results from the redundant element and the nonredundant wordline are compared. If a difference is found, a wordline fault is detected. For example, if more than two bits differ, double-error-detect ECC codes cannot reliably discover the fault. Thus, with a wordline fault of more than two bits, the disclosed systems and methods halt the machine to prevent further corruption.

In some examples, monitoring for an entire memory of a computing device is provided causing monitoring assignment of a redundant element to move incrementally from wordline to wordline over the course of time, monitoring each in turn for faults. Advantageously, this sweep is simple to implement and is carried out almost entirely using existing hardware and storage that a memory vulnerable to wordline faults is likely to already have, namely wordline repair features. While the wordline level fault monitoring is not constant for every wordline of a memory, combining this feature with ECC and repair capabilities nevertheless improves fault detection at low cost.

Example Implementations

Example 1: A computing device comprising: a cache memory, and at least one processor coupled to the cache memory, wherein the at least one processor is configured to: copy data written to one or more nonredundant wordlines of the cache memory to one or more redundant wordlines of the cache memory, detect a mismatch between data read from the one or more nonredundant wordlines and data stored in the one or more redundant wordlines, and perform a remediation action in response to detecting the mismatch.

Example 2. The computing device of example 1, wherein the at least one processor is further configured to: identify a wordline fault in a nonredundant wordline of the one or more nonredundant wordlines.

Example 3: The computing device of any of examples 1 or 2, wherein the remediation action corresponds to halting operation of the computing device.

Example 4: The computing device of any of examples 1-3, wherein the remediation action corresponds to repairing the cache memory by taking a nonredundant wordline of the one or more nonredundant wordlines out of service and reassigning a redundant wordline of the redundant wordlines in place of the nonredundant wordline.

Example 5: The computing device of any of examples 1-4, wherein the at least one processor is further configured to: identify multiple faults using a redundant wordline of the one or more nonredundant wordlines to monitor multiple nonredundant wordlines of the one or more nonredundant wordlines.

Example 6: The computing device of any of examples 1-5, wherein the at least one processor is further configured to: perform a monitoring action in response to the identifying, wherein the monitoring action corresponds to at least one of: taking the redundant wordline out of service in response to the identifying, using at least one different redundant wordline of the redundant wordlines to monitor the multiple nonredundant wordlines, returning to service at least one nonredundant wordline of the multiple nonredundant wordlines, or returning to service, as a redundant wordline, at least one previously reassigned redundant wordline that was previously reassigned as a nonredundant wordline.

Example 7: The computing device of any of examples 1-6, wherein the at least one processor is further configured to: identify that monitoring of a nonredundant wordline of the one or more nonredundant wordlines is complete.

Example 8: The computing device of any of examples 1-7, wherein the at least one processor is further configured to: reassign, in response to the identification, a redundant wordline of the one or more redundant wordlines to monitor a different nonredundant wordline of the of the one or more nonredundant wordlines.

Example 9: The computing device of any of examples 1-8, wherein the at least one processor is configured to identify that monitoring of the nonredundant wordline is complete at least in part by identifying that at least one of: the read data matches the stored data, a predetermined monitoring duration has expired, or a predetermined number of accesses has occurred.

Example 10: A system for continuous wordline monitoring includes at least one physical processor and physical memory comprising computer-executable instructions. When executed by the physical processor, the instructions cause the physical processor to: copy, to one or more redundant wordlines of a memory of a computing device, data written to one or more nonredundant wordlines of the memory, detect a mismatch between data read from the one or more nonredundant wordlines and data stored in the one or more redundant wordlines, and perform a remediation action in response to detecting the mismatch.

Example 11: The system of example 10, wherein the computer-executable instructions further cause the physical processor to: identify, in response to the comparison, a wordline fault in a nonredundant wordline of the one or more nonredundant wordlines.

Example 12: The system of any of examples 10 or 11, wherein the remediation action corresponds to halting operation of the computing device.

Example 13: The system of any of examples 10-12, wherein the remediation action corresponds to repairing the memory by taking a nonredundant wordline of the one or more nonredundant wordlines out of service and reassigning a redundant wordline of the redundant wordlines in place of the nonredundant wordline.

Example 14: The system of any of examples 10-13, wherein the computer-executable instructions further cause the physical processor to: identify multiple faults using a nonredundant wordline of the one or more nonredundant wordlines to monitor multiple nonredundant wordlines of the one or more nonredundant wordlines.

Example 15: The system of any of examples 10-14, wherein the computer-executable instructions further cause the physical processor to: perform a monitoring action in response to the identifying, wherein the monitoring action corresponds to at least one of: taking the nonredundant wordline out of service in response to the identifying, using at least one different nonredundant wordline of the nonredundant wordlines to monitor the multiple nonredundant wordlines, returning to service at least one nonredundant wordline of the multiple nonredundant wordlines, or returning to service, as a redundant wordline, at least one previously reassigned redundant wordline that was previously reassigned as a nonredundant wordline.

Example 16: The system of any of examples 10-15, wherein the computer-executable instructions further cause the physical processor to: identify that monitoring of a nonredundant wordline of the one or more nonredundant wordlines is complete.

Example 17: The system of any of examples 10-16, wherein the computer-executable instructions further cause the physical processor to reassign, in response to the identification, a redundant wordline of the one or more redundant wordlines to monitor a different nonredundant wordline of the of the one or more nonredundant wordlines.

Example 18: The system of any of examples 10-17, wherein identifying that monitoring of the nonredundant wordline is complete includes identifying that at least one of: the read data matches the stored data, a predetermined monitoring duration has expired, or a predetermined number of accesses has occurred.

Example 19: A computer-implemented method for continuous wordline monitoring, at least a portion of the method being performed by a computing device comprising at least one processor, the method comprising: copying, by the at least one processor, data written to one or more nonredundant wordlines of a memory of the computing device to one or more redundant wordlines of the memory of the computing device, detecting, by the at least one processor, a mismatch between data read from the one or more nonredundant wordlines and data stored in the one or more redundant wordlines, and performing, by the at least one processor, a remediation action in response to detecting the mismatch.

Example 20: The method of example 19, further comprising: identifying, by the at least one processor in response to the detection, a wordline fault in a nonredundant wordline of the one or more nonredundant wordlines.

Figure 2:
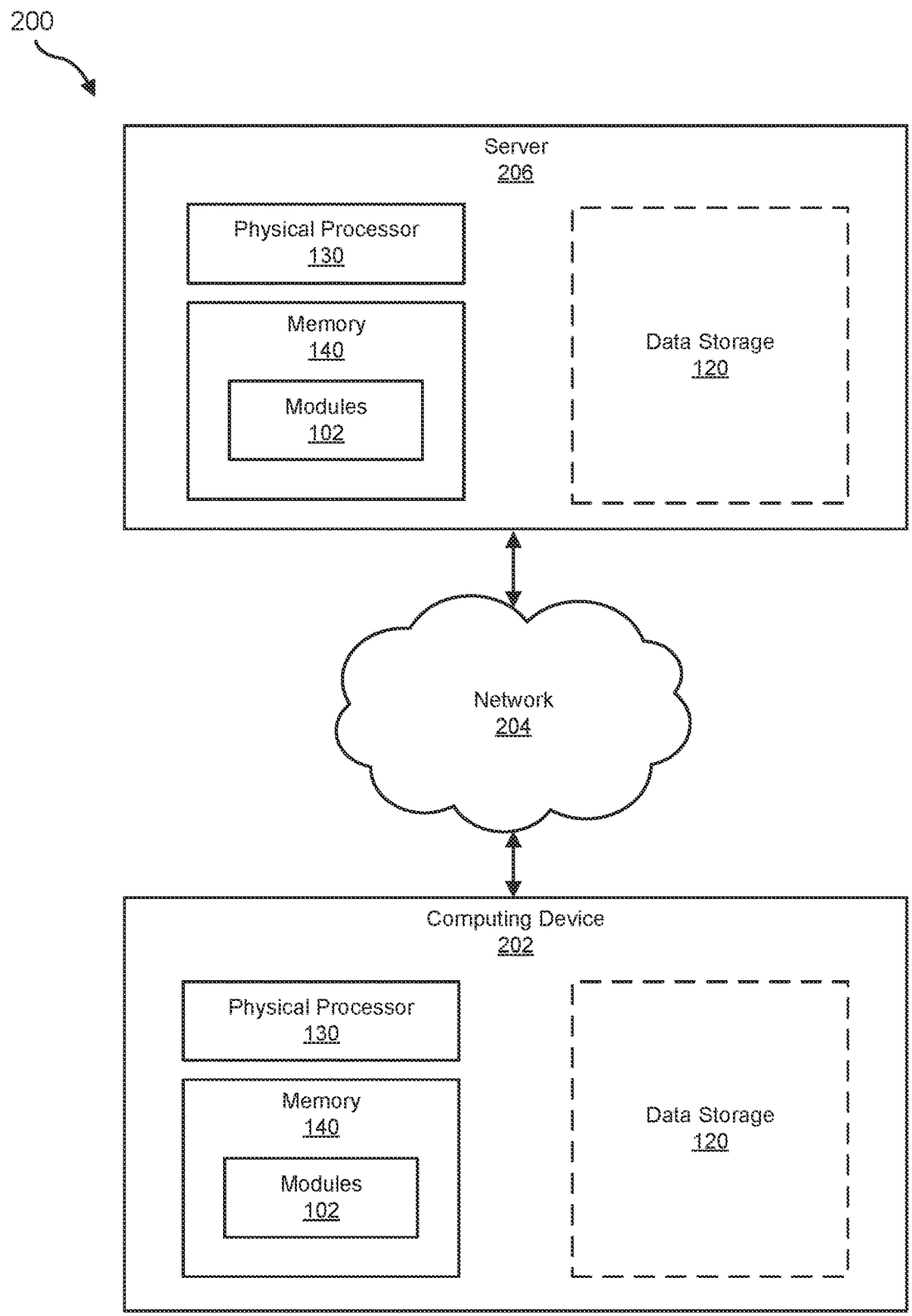
FIG. 2 is a block diagram of an additional example system for continuous wordline monitoring.

The following will provide, with reference to FIGS. 1-2, detailed descriptions of example systems for continuous wordline monitoring. Detailed descriptions of corresponding computer-implemented methods will also be provided in connection with FIGS. 3-6. In addition, detailed descriptions of example computer-implemented methods with reassignment of a redundant wordline to monitor a different nonredundant wordline will be provided in connection with FIGS. 7-8. Also, detailed descriptions of example computer-implemented methods with removal from service of a redundant wordline will be provided in connection with FIGS. 9-10. detailed descriptions of example computer-implemented methods combining these functionalities will be provided in connection with FIG. 11.

FIG. 1 is a block diagram of an example system 100 for continuous wordline monitoring. As illustrated in this figure, example system 100 includes one or more modules 102 for performing one or more tasks. As will be explained in greater detail below, modules 102 include a copy module 104, a detection module 106, and an action module 108. In some examples of system 100, modules 102 additionally include one or more other modules 110. Although illustrated as separate elements, one or more of modules 102 in FIG. 1 represents portions of a single module or application.

In certain embodiments, one or more of modules 102 in FIG. 1 represents one or more software applications or programs that, when executed by a computing device, causes the computing device to perform one or more tasks. For example, and as will be described in greater detail below, one or more of modules 102 represents modules stored and configured to run on one or more computing devices, such as the devices illustrated in FIG. 2 (e.g., computing device 202 and/or server 206). One or more of modules 102 in FIG. 1 also represents all or portions of one or more special-purpose computers configured to perform one or more tasks.

As illustrated in FIG. 1, example system 100 also includes one or more memory devices, such as memory 140. Memory 140 generally represents any type or form of volatile or non-volatile storage device or medium capable of storing data and/or computer-readable instructions. In one example, memory 140 stores, loads, and/or maintains one or more of modules 102. Examples of memory 140 include, without limitation, Random Access Memory (RAM), Read Only Memory (ROM), flash memory, Hard Disk Drives (HDDs), Solid-State Drives (SSDs), optical disk drives, caches, variations or combinations of one or more of the same, or any other suitable storage memory.

As illustrated in FIG. 1, example system 100 also includes one or more physical processors, such as physical processor 130. Physical processor 130 generally represents any type or form of hardware-implemented processing unit capable of interpreting and/or executing computer-readable instructions. In one example, physical processor 130 accesses and/or modifies one or more of modules 102 stored in memory 140. Additionally or alternatively, physical processor 130 executes one or more of modules 102 to facilitate continuous wordline monitoring. Examples of physical processor 130 include, without limitation, microprocessors, microcontrollers, Central Processing Units (CPUs), Field-Programmable Gate Arrays (FPGAs) that implement softcore processors, Application-Specific Integrated Circuits (ASICs), portions of one or more of the same, variations or combinations of one or more of the same, or any other suitable physical processor.

As illustrated in FIG. 1, example system 100 also includes one or more instances of stored data, such as data storage 120. Data storage 120 generally represents any type or form of stored data. In one example, data storage 120 includes databases, spreadsheets, tables, lists, matrices, trees, or any other type of data structure. Examples of data storage 120 include, without limitation, wordline monitoring assignments 122A, written data 122B, read data 122C, and stored data 122D. In some examples, data storage 120 includes monitoring criteria 122E, such as monitoring thresholds (e.g., monitoring duration, number of accesses) and/or monitoring status (e.g., current monitoring durations, current number of accesses, validation timestamps, priority queues, etc.).

Example system 100 in FIG. 1 is implemented in a variety of ways. For example, all or a portion of example system 100 represents portions of example system 200 in FIG. 2. As shown in FIG. 2, system 200 includes a computing device 202 in communication with a server 206 via a network 204.

In one example, all or a portion of the functionality of modules 102 is performed by computing device 202, server 206, and/or any other suitable computing system. As will be described in greater detail below, one or more of modules 102 from FIG. 1, when executed by at least one processor of computing device 202 and/or server 206, enable computing device 202 and/or server 206 to perform continuous wordline monitoring.

Computing device 202 generally represents any type or form of computing device capable of reading computer-executable instructions. For example, computing device is any computer capable of receiving, processing, and storing data. In some examples, computing device includes a physical processor connected to a large memory array having redundant elements. Additional examples of computing device 202 include, without limitation, laptops, tablets, desktops, servers, cellular phones, Personal Digital Assistants (PDAs), multimedia players, embedded systems, wearable devices (e.g., smart watches, smart glasses, etc.), smart vehicles, so-called Internet-of-Things devices (e.g., smart appliances, etc.), gaming consoles, variations or combinations of one or more of the same, or any other suitable computing device.

Server 206 generally represents any type or form of computing device that is capable of receiving, processing, and storing data. In some examples, server 206 includes a physical processor connected to a large memory array having redundant elements. Additional examples of server 206 include, without limitation, storage servers, database servers, application servers, and/or web servers configured to run certain software applications and/or provide various storage, database, and/or web services. Although illustrated as a single entity in FIG. 2, server 206 includes and/or represents a plurality of servers that work and/or operate in conjunction with one another.

Network 204 generally represents any medium or architecture capable of facilitating communication or data transfer. In one example, network 204 facilitates communication between computing device 202 and server 206. In this example, network 204 facilitates communication or data transfer using wireless and/or wired connections. Examples of network 204 include, without limitation, an intranet, a Wide Area Network (WAN), a Local Area Network (LAN), a Personal Area Network (PAN), the Internet, Power Line Communications (PLC), a cellular network (e.g., a Global System for Mobile Communications (GSM) network), portions of one or more of the same, variations or combinations of one or more of the same, or any other suitable network.

Many other devices or subsystems is connected to system 100 in FIG. 1 and/or system 200 in FIG. 2. Conversely, all of the components and devices illustrated in FIGS. 1 and 2 need not be present to practice the embodiments described and/or illustrated herein. In various examples, the devices and subsystems referenced above are interconnected in different ways from that shown in FIG. 2. Systems 100 and 200 also employ any number of software, firmware, and/or hardware configurations. For example, one or more of the example embodiments disclosed herein are encoded as a computer program (also referred to as computer software, software applications, computer-readable instructions, and/or computer control logic) on a computer-readable medium.

The term "computer-readable medium," as used herein, generally refers to any form of device, carrier, or medium capable of storing or carrying computer-readable instructions. Examples of computer-readable media include, without limitation, transmission-type media, such as carrier waves, and non-transitory-type media, such as magneticstorage media (e.g., hard disk drives, tape drives, and floppy disks), optical-storage media (e.g., Compact Disks (CDs), Digital Video Disks (DVDs), and BLU-RAY disks), electronic-storage media (e.g., solid-state drives and flash media), and other distribution systems.

Figure 3:
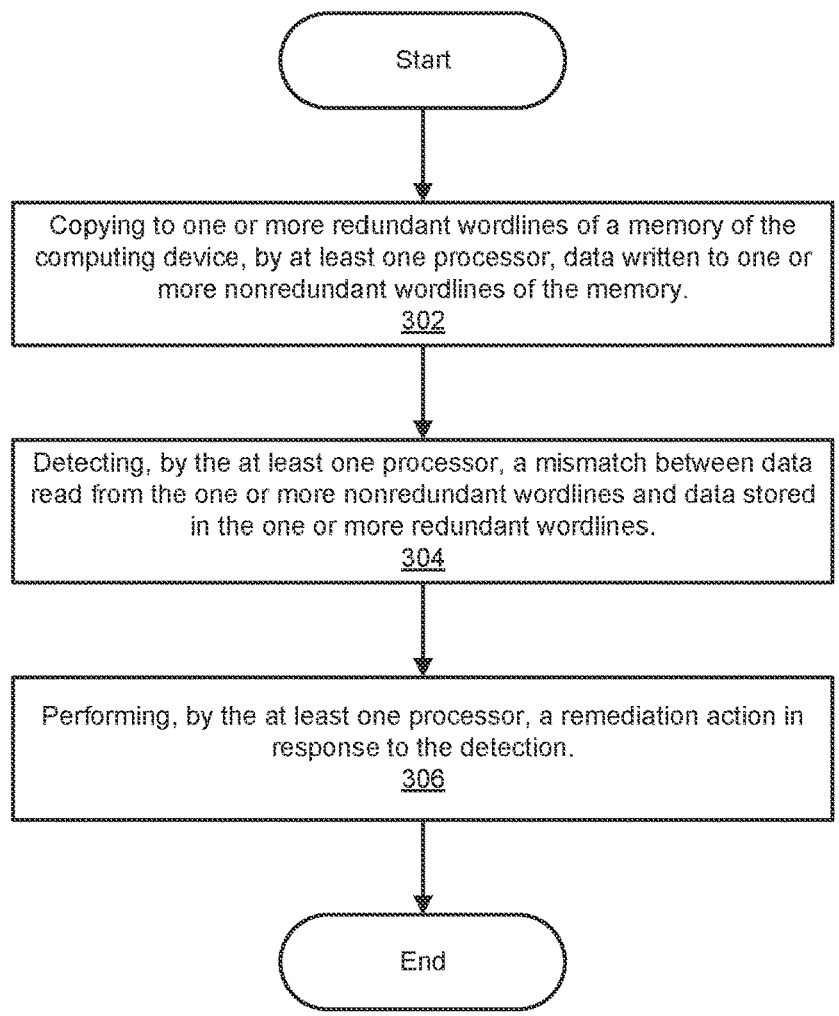
FIG. 3 is a flow diagram of an example method for continuous wordline monitoring.

FIG. 3 is a flow diagram of an example computer-implemented method 300 for continuous wordline monitoring. The steps shown in FIG. 3 are performed by any suitable computer-executable code and/or computing system, including system 100 in FIG. 1, system 200 in FIG. 2, and/or variations or combinations of one or more of the same. In one example, each of the steps shown in FIG. 3 represent an algorithm whose structure includes and/or is represented by multiple sub-steps, examples of which will be provided in greater detail below.

As illustrated in FIG. 3, at step 302 one or more of the systems described herein copy data. For example, copy module 104, as part of computing device 202 in FIG. 2, performs copying to one or more redundant wordlines of a memory of a computing device, by at least one processor, data written to one or more nonredundant wordlines of the memory.

As used herein, the term "wordline" generally refers to one or more rows (e.g., eight bits) of a memory cell. For example, and without limitation, wordline refers to an array of rows of memory cells in random access memory, used with a bitline to generate the address of each cell. In some examples, a wordline is a horizontal strip of polysilicon that connects to a transistor's (cell's) control gate, and a bitline is connected to a cell's drain. Different voltage combinations applied to the wordline and bitline define a read, erase, or write operation on the cell. In various examples, wordlines are implemented in various types of RAM, such as DRAM or SRAM. For example, a single piece of DRAM is composed of a large two dimensional array of cells containing ones or zeros that are connected by bitlines and wordlines. Each individual cell can be accessed by utilizing the intersection of a specific wordline and bitline and reading from or storing to the cell at this address. Similarly, SRAM arrays are arranged in several rows and columns of storage bit-cells called bit-lines (BL and BL') and word-lines (WL) to control data access and storage. The bit-cells are bi-stable flip-flops which comprise 4 to 11 transistors with pull-up (PU), pull-down (PD), and pass-gate (PG) networks.

As used herein, the term "redundant wordline" generally refers to a spare row or column in a memory array. For example, and without limitation, RAM arrays often have included spare rows and columns to improve yields. Spare rows and columns provide tolerance of minor fabrication defects which have caused a small number of rows or columns to be inoperable. In some examples, the defective rows and columns are physically disconnected from the rest of the array by triggering a programmable fuse or by cutting the wire by a laser. In some examples, the spare rows or columns are substituted in by remapping logic in the row and column decoders.

As used herein, the term "nonredundant wordline" generally refers to a row or column in a memory array that is not a redundant wordline. For example, and without limitation, nonredundant wordlines provide the normal RAM functionality by storing information used by programs of a computing device. In some examples, a nonredundant wordline corresponds to a formerly redundant wordline that has been reassigned in place of a faulty nonredundant wordline that was taken out of service.

Various examples of the systems described herein perform step 302 in a variety of ways. In one example, copy module 104, as part of computing device 202 in FIG. 2, observes data written to a nonredundant wordline of the memory and, in response to the write operation, copies the written data to a redundant wordline assigned to monitor that nonredundant wordline. Alternatively or additionally, copy module 104, as part of computing device 202 in FIG. 2, receives the written data as input and copies the written data to the redundant wordline in response to receiving the written data. Alternatively or additionally, copy module 104, as part of computing device 202 in FIG. 2, intercepts data to be written to the nonredundant wordline, copies the intercepted data to the redundant wordline, and provides the intercepted data to one or more elements configured to write the intercepted data to the nonredundant wordline.

At step 304 one or more of the systems described herein detects an error. For example, detection module 106, as part of computing device 202 in FIG. 2, performs detecting, by the at least one processor, a mismatch between data read from the one or more nonredundant wordlines and data stored in the one or more redundant wordlines.

In various examples, the systems described herein perform step 304 in a variety of ways. In one example, detection module 104, as part of computing device 202 in FIG. 2, observes data read from a nonredundant wordline of the memory and, in response to this access, reads stored data that was copied to the nonredundant wordline in step 302. In response to a mismatch in the read data and the stored data, detection module 104 detects an error. For example, detection module 104 identifies, by the at least one processor in response to the comparison, a wordline fault in a nonredundant wordline of the one or more nonredundant wordlines. Alternatively or additionally, detection module 104, as part of computing device 202 in FIG. 2, receives the written data and/or the stored data as inputs and detects the mismatch by comparing the two inputs. Alternatively or additionally, detection module 104, as part of computing device 202 in FIG. 2, intercepts an access command and accesses both the nonredundant wordline and the nonredundant wordline to perform the comparison and detect the mismatch. In some of these examples, detection module 104 normally returns the read data to one or more elements configured to access the memory but avoids doing so in the case of a mismatch, thus avoiding further data corruption.

At step 306 one or more of the systems described herein performs an action in response to detecting the mismatch. For example, action module 106, as part of computing device 202 in FIG. 2, performs, by the at least one processor, a remediation action in response to detecting the mismatch.

In various examples, the systems described herein perform step 306 in a variety of ways. In one example, action module 104, as part of computing device 202 in FIG. 2, performs the remediation action by halting operation of the computing device. Alternatively or additionally, action module 104, as part of computing device 202 in FIG. 2, performs the remediation action by repairing the memory. In some of these examples, the repair includes taking a nonredundant wordline of the one or more nonredundant wordlines out of service and reassigning a redundant wordline of the redundant wordlines in place of the nonredundant wordline. Such reassignment can be performed in various ways, such as by modifying a link to a memory address in a data structure (e.g., map, directory, etc.) or by readdressing lines of the memory. In some examples, the reassignment causes the reassigned redundant wordline to be designated by an address previously used to access the nonredundant wordline that was taken out of service. Depending on implementation, however, there can be benefits (e.g., avoiding data fragmentation, sector scans performed by addresses instead of links, etc.) to maintaining an order of the memory addresses with respect to contiguous nonredundant wordlines of the memory. Therefore, in other examples, the repair can be accomplished by readdressing one or more nonredundant wordlines so that a different nonredundant wordline directly replaces the nonredundant wordline taken out of service, and the redundant wordline replaces one of the readdressed nonredundant wordlines. For example, one or more nonredundant wordlines can be readdressed, with one of the readdressed nonredundant wordlines being designated by the address previously used to access the nonredundant wordline that was taken out of service, and with the reassigned redundant wordline being designated by an address previously used to access one of the readdressed nonredundant wordlines. In one such example, the reassignment can uniformly adjust (e.g., increment or decrement) the addresses of the redundant wordline and all nonredundant wordlines situated between the redundant wordline and the wordline taken out of service, thus maintaining an order of addresses in a contiguous memory region in which the readdressed wordlines are physically located. In some of these examples, the remediation action performed at step 306 is performed at least in part based on monitoring criteria 102E, as explained in greater detail with reference to FIGS. 7-11.

Figure 4:
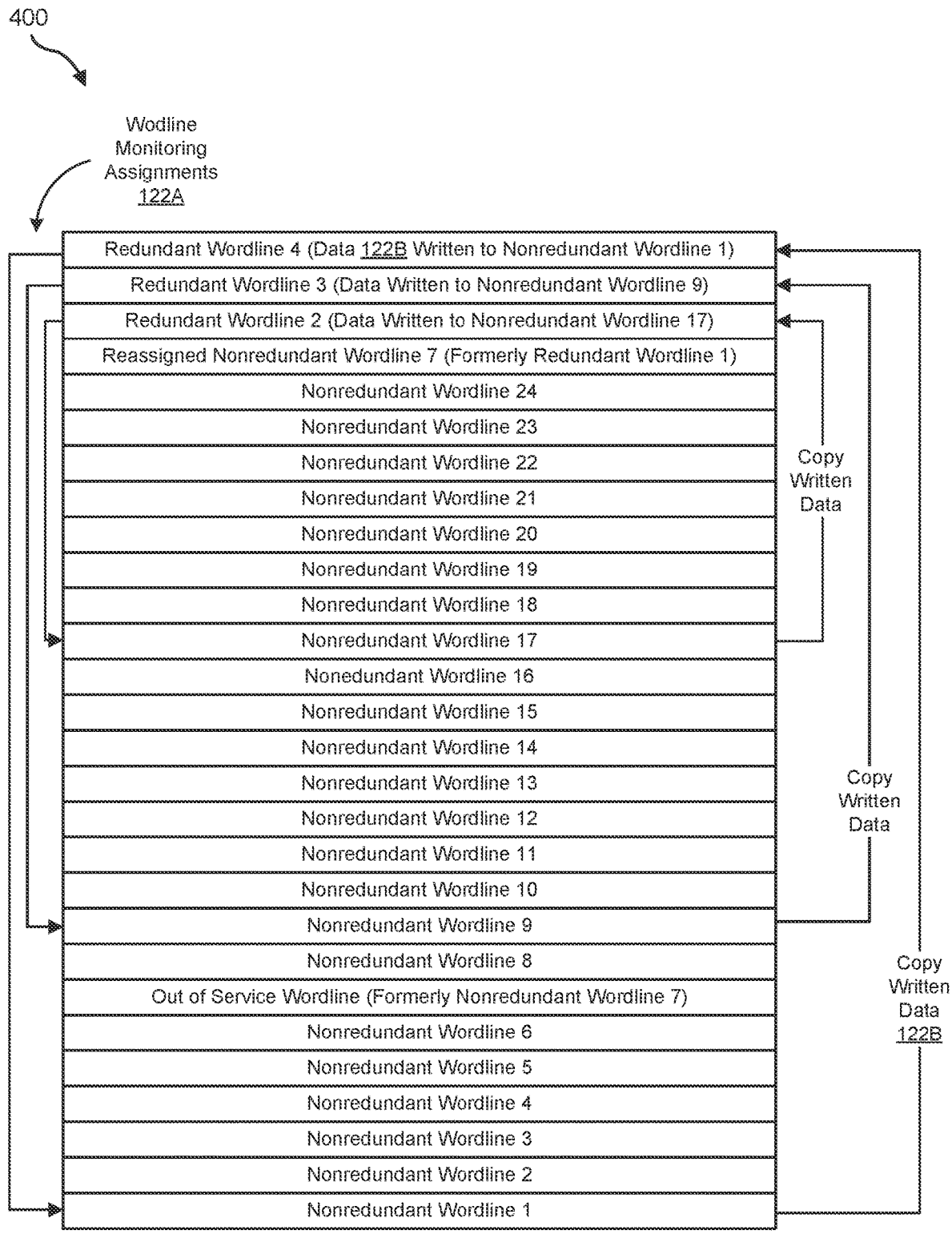
FIG. 4 is a block diagram illustrating an example copy operation with reference to an example set of wordlines of a memory of a computing device.
Figure 5:
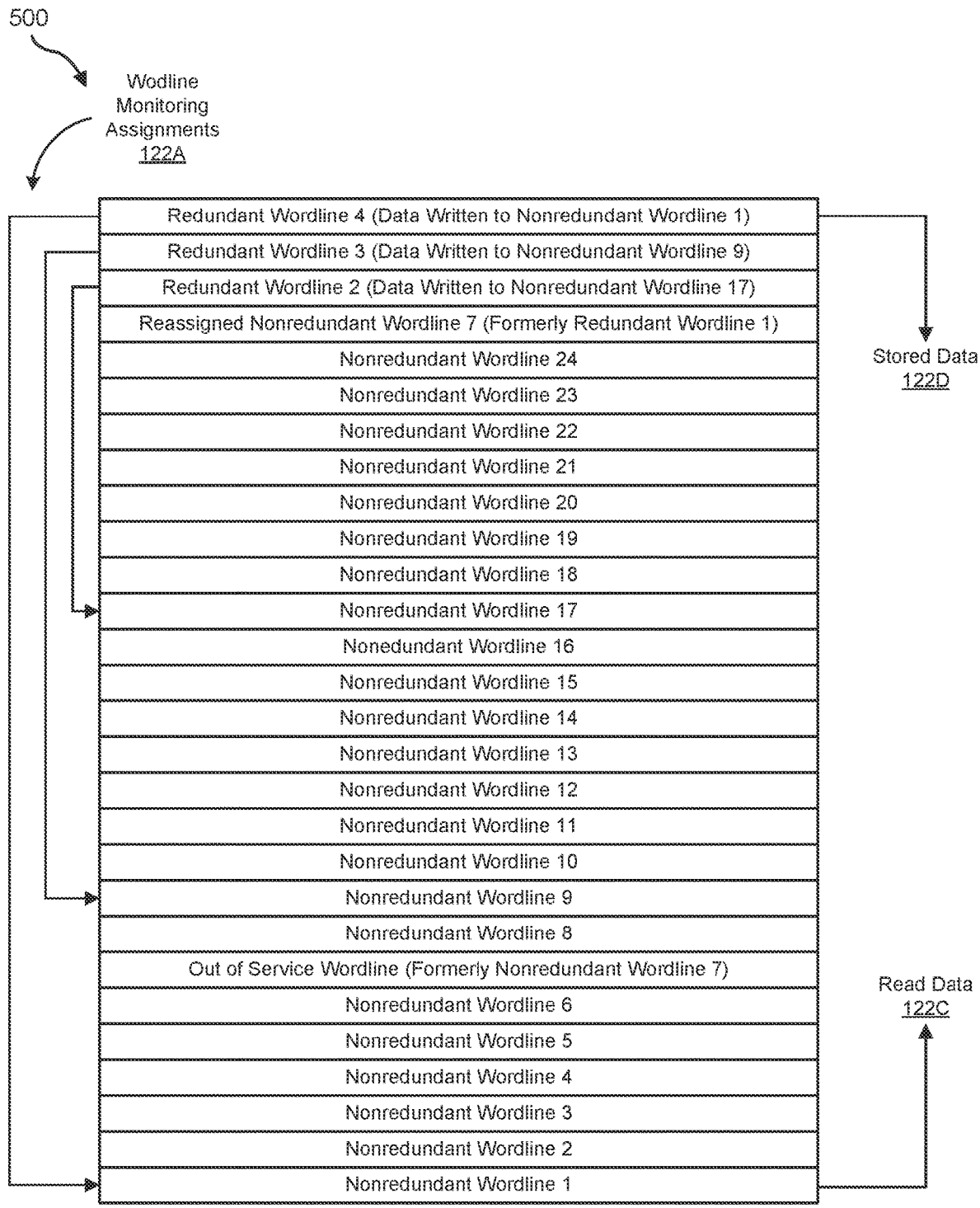
FIG. 5 is a block diagram illustrating an example detection operation with reference to the example set of wordlines of the memory of the computing device.
Figure 6:
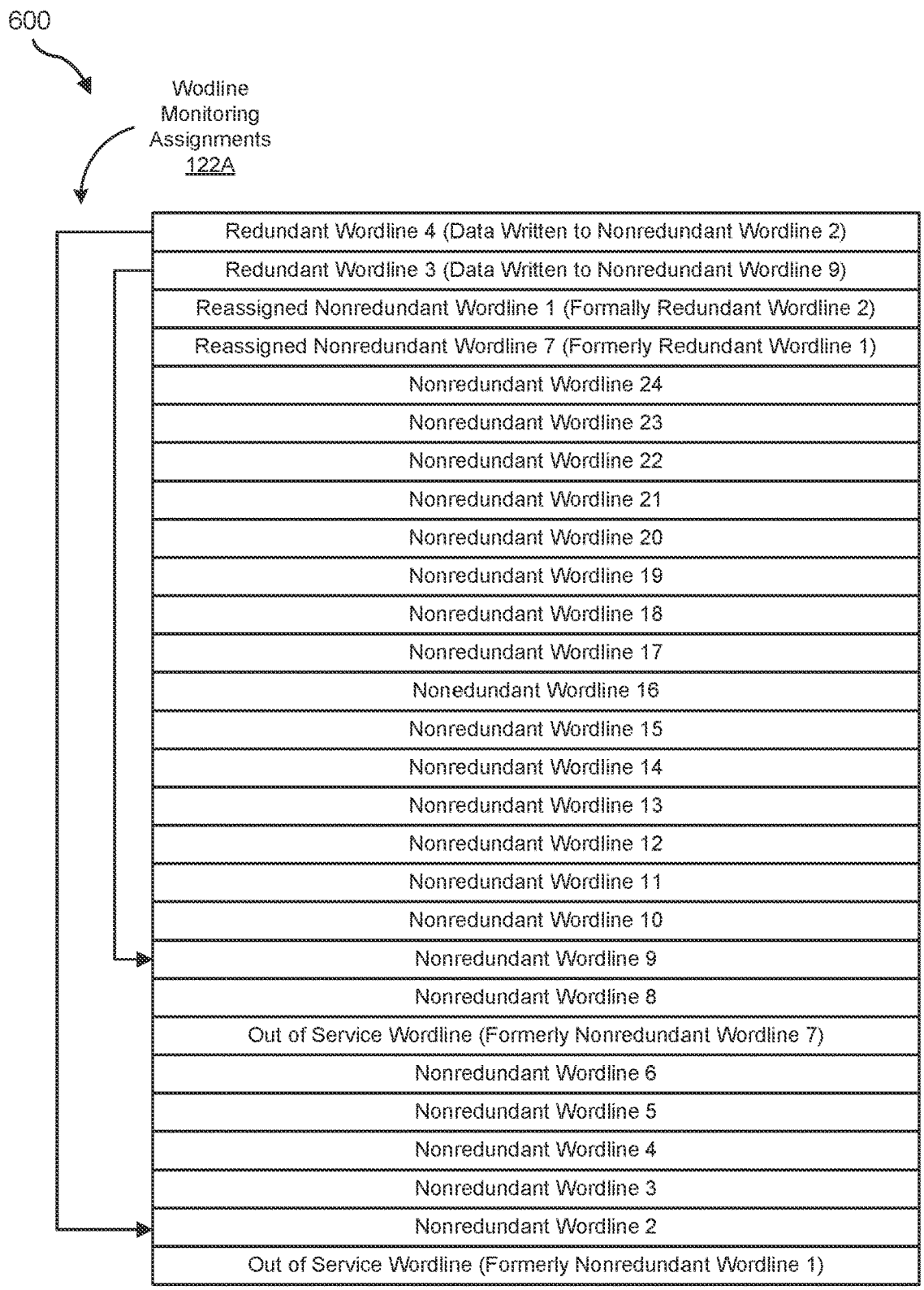
FIG. 6 is a block diagram illustrating an example remediation operation with reference to the example set of wordlines of the memory of the computing device.

FIGS. 4-6 illustrate an example application of the method of FIG. 3 to a set of wordlines. For example, FIG. 4 illustrates a set of wordlines 400 and demonstrates wordline monitoring assignments 122A and copying of written data 122B to a redundant wordline assigned to monitor a nonredundant wordline to which the data 122B is written. The state of the wordlines 400 reflects application of an example of step 302 of FIG. 3. Additionally, FIG. 5 illustrates a set of wordlines 500 with the monitoring assignments 122A and demonstrates detection of a mismatch between data 122C read from the nonredundant wordline and data 122D stored in the redundant wordline assigned to monitor that nonredundant wordline. The state of the wordlines 500 reflects application of an example of step 304 of FIG. 3. Also, FIG. 6 illustrates a set of wordlines 600 with monitoring assignments 122A that are modified to reassign the redundant wordline to monitor a different nonredundant wordline. FIG. 6 further illustrates that the nonredundant wordline has been taken out of service, and another redundant wordline has been reassigned in place of this non-redundant wordline. The state of the wordlines 600 reflects application of an example of step 306 of FIG. 3.

The example assignments and reassignments shown in FIGS. 4-6 are illustrated in a manner that avoids crossed or overlapped arrows that would otherwise obscure the figures. However, the assignments and reassignments are exemplary, and it should be understood that the redundant wordline used for the repair of the wordline taken out of service can be selected in various ways. For example, the redundant wordline can be selected that is physically closest to the wordline taken out of service. Alternatively, the redundant wordline can be selected because it is a most recently validated redundant wordline, where successful use of the redundant wordline to validate one or more nonredundant wordlines effectively validates the redundant wordline as well. In another alternative, the redundant wordline can be selected because it is the only redundant wordline (e.g., or one of few) that is capable of replacing the wordline taken out of service. In another alternative, the redundant wordline can be selected at random.

Figure 7:
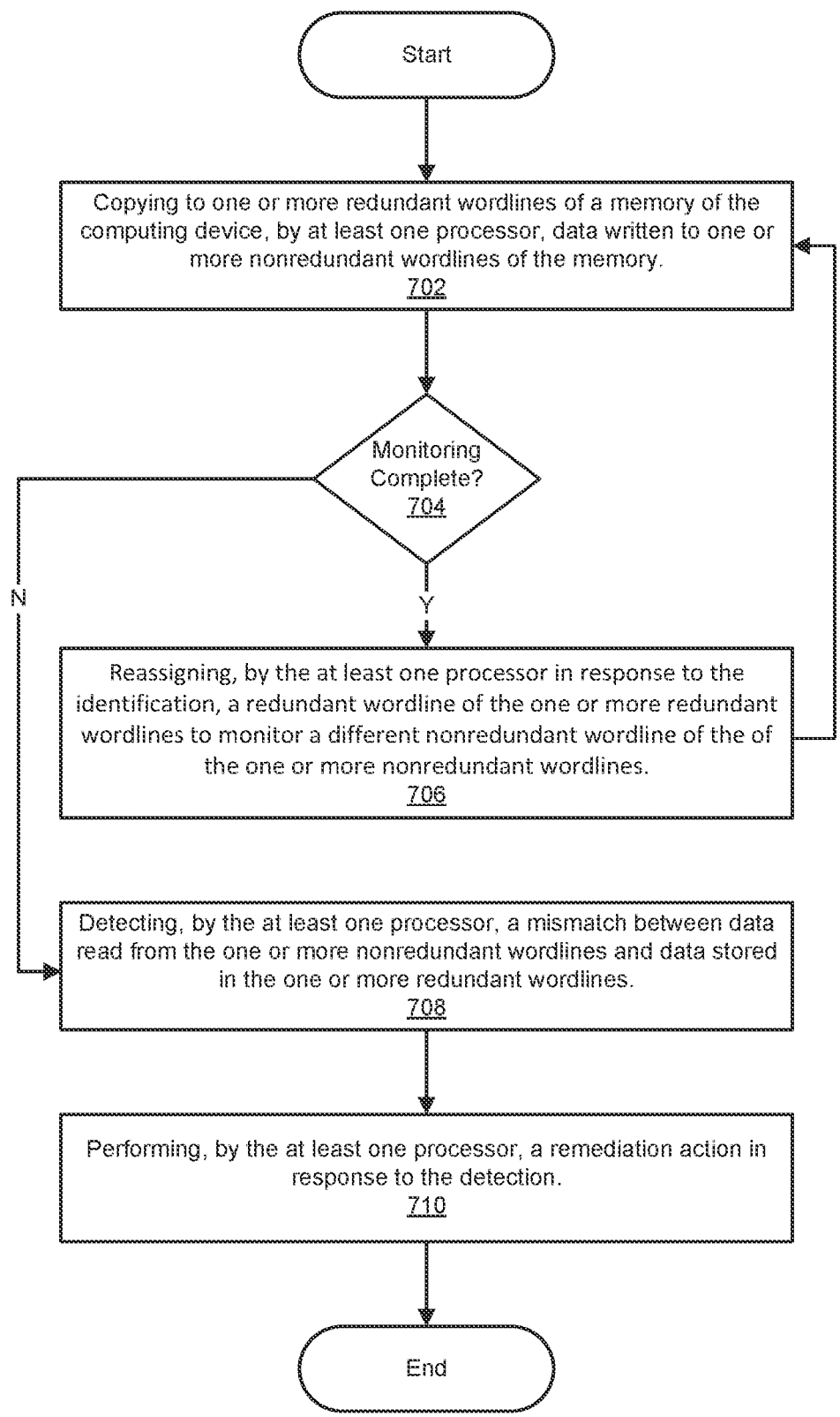
FIG. 7 is a flow diagram of an example method for continuous wordline monitoring with an example reassignment of a redundant wordline to monitor a different nonredundant wordline.

FIG. 7 is a flow diagram of an example computer-implemented method 700 for continuous wordline monitoring with reassignment of a redundant wordline to monitor a different nonredundant wordline. The steps shown in FIG. 7 are performed by any suitable computer-executable code and/or computing system, including system 100 in FIG. 1, system 200 in FIG. 2, and/or variations or combinations of one or more of the same. In one example, each of the steps shown in FIG. 7 represents an algorithm whose structure includes and/or is represented by multiple sub-steps, examples of which will be provided in greater detail below.

Method 700 includes steps 702, 708, and 710, examples of which perform one or more operations as described above with reference, respectively, to steps 302, 304, and 306 of FIG. 3. Further, method 700 includes steps 704 and 706, example operations of which accomplish reassignment of a redundant wordline to monitor a different nonredundant wordline.

At step 702, one or more of the systems described herein copy data. For example, copy module 104, as part of computing device 202 in FIG. 2, performs copying to one or more redundant wordlines of a memory of a computing device, by at least one processor, data written to one or more nonredundant wordlines of the memory. In some examples, step 702 additionally includes recording information in monitoring criteria 102E such as one or more timestamps recording one or more times when the written data is copied. Various ways in which the operations of step 702 can be performed are previously described with reference to step 302 of FIG. 3.

At step 704 one or more of the systems described herein identifies that monitoring is complete. For example, other module(s) 108, as part of computing device 202 in FIG. 2, identifies, by the at least one processor, that monitoring of a nonredundant wordline of the one or more nonredundant wordlines is complete.

In various examples, the systems described herein perform step 704 in a variety of ways. In one example, other module(s) 110, as part of computing device 202 in FIG. 2, identifies that monitoring is complete in response to satisfaction of a threshold condition. In some examples, the threshold condition includes a minimum number (e.g., two) of successful accesses (e.g., accesses that do not result in detecting a fault) of a monitored nonredundant wordline in order to trigger reassignment of a corresponding redundant wordline. In additional or alternative examples, a threshold condition includes a monitoring duration that corresponding to a maximum time (e.g., one hour) that a redundant wordline should be assigned to monitor a particular nonredundant wordline. In additional or alternative examples, a threshold condition includes a minimum amount of time (e.g., a microsecond, a millisecond, etc.) that a redundant wordline should be assigned to monitor a particular nonredundant wordline. In additional or alternative examples, a threshold condition includes a minimum duration (e.g., a microsecond, a millisecond, etc.) between writing and reading data and/or a minimum duration (e.g., a microsecond, a millisecond, etc.) between accesses to ensure that an ability of the wordline to refresh accurately is sufficiently tested. In these and other examples, other module(s) 110, as part of computing device 202 in FIG. 2, determine that monitoring of a nonredundant wordline is complete by identifying that the read data matches the stored data, that a predetermined monitoring duration has expired, and/or that a predetermined number of accesses has occurred.

At step 706 one or more of the systems described herein reassigns a redundant wordline. For example, other module(s) 110, as part of computing device 202 in FIG. 2, reassign, by the at least one processor in response to the identification, a redundant wordline of the one or more redundant wordlines to monitor a different nonredundant wordline of the one or more nonredundant wordlines.

In various examples, the systems described herein perform step 706 in a variety of ways. In one example, other module(s) 110, as part of computing device 202 in FIG. 2, reassign the redundant wordline to monitor a next nonredundant wordline based on a validation timestamp (e.g., oldest timestamp) and/or a reference in a monitoring queue included in monitoring criteria 102E. In these and other examples, other module(s) 110, as part of computing device 202 in FIG. 2, timestamp the recently validated nonredundant wordline and/or place a reference (e.g., address) to the recently validated nonredundant wordline in the monitoring queue (e.g., a first in first out queue). In some examples, processing returns from step 706 to step 702 until detection of a mismatch and/or identification of monitoring completion.

At step 708 one or more of the systems described herein detects an error. For example, detection module 106, as part of computing device 202 in FIG. 2, performs detecting, by the at least one processor, a mismatch between data read from the one or more nonredundant wordlines and data stored in the one or more redundant wordlines. Various ways in which the operations of step 702 can be performed are previously described with reference to step 304 of FIG. 3. In additional or alternative examples, step 708 also includes recording information in monitoring criteria 102E, such as one or more counts and/or one or more timestamps recording when data is read and a comparison does not result in detection of a mismatch. This information can be used in step 704 in determining whether monitoring is complete.

At step 710 one or more of the systems described herein performs an action in response to detecting the mismatch. For example, action module 106, as part of computing device 202 in FIG. 2, performs, by the at least one processor, a remediation action in response to detecting the mismatch. Various ways in which the operations of step 702 can be performed are previously described with reference to step 306 of FIG. 3.

Figure 8:
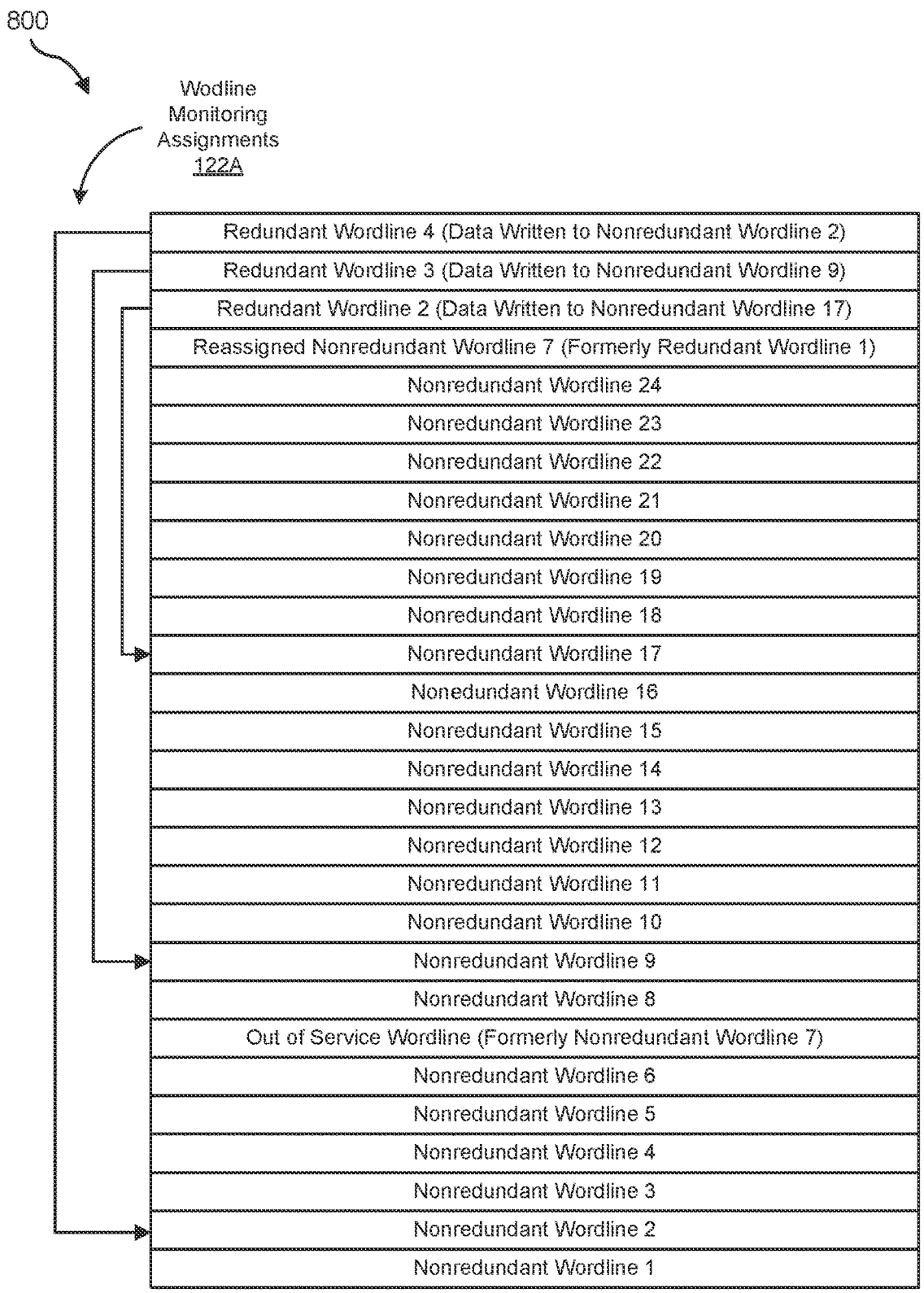
FIG. 8 is a block diagram illustrating an example reassignment operation with reference to the example set of wordlines of the memory of the computing device.

FIG. 8 illustrates an example application of the method of FIG. 7 to a set of wordlines 800. For example, FIG. 8 demonstrates wordline monitoring assignments 122A that are modified to reassign a redundant wordline to monitor a different nonredundant wordline. As a result of the reassignment, data written to the different nonredundant wordline is copied to the reassigned redundant wordline. The state of the wordlines 800 reflects application of an example of steps 702-706 of method 700 of FIG. 7.

Figure 9:
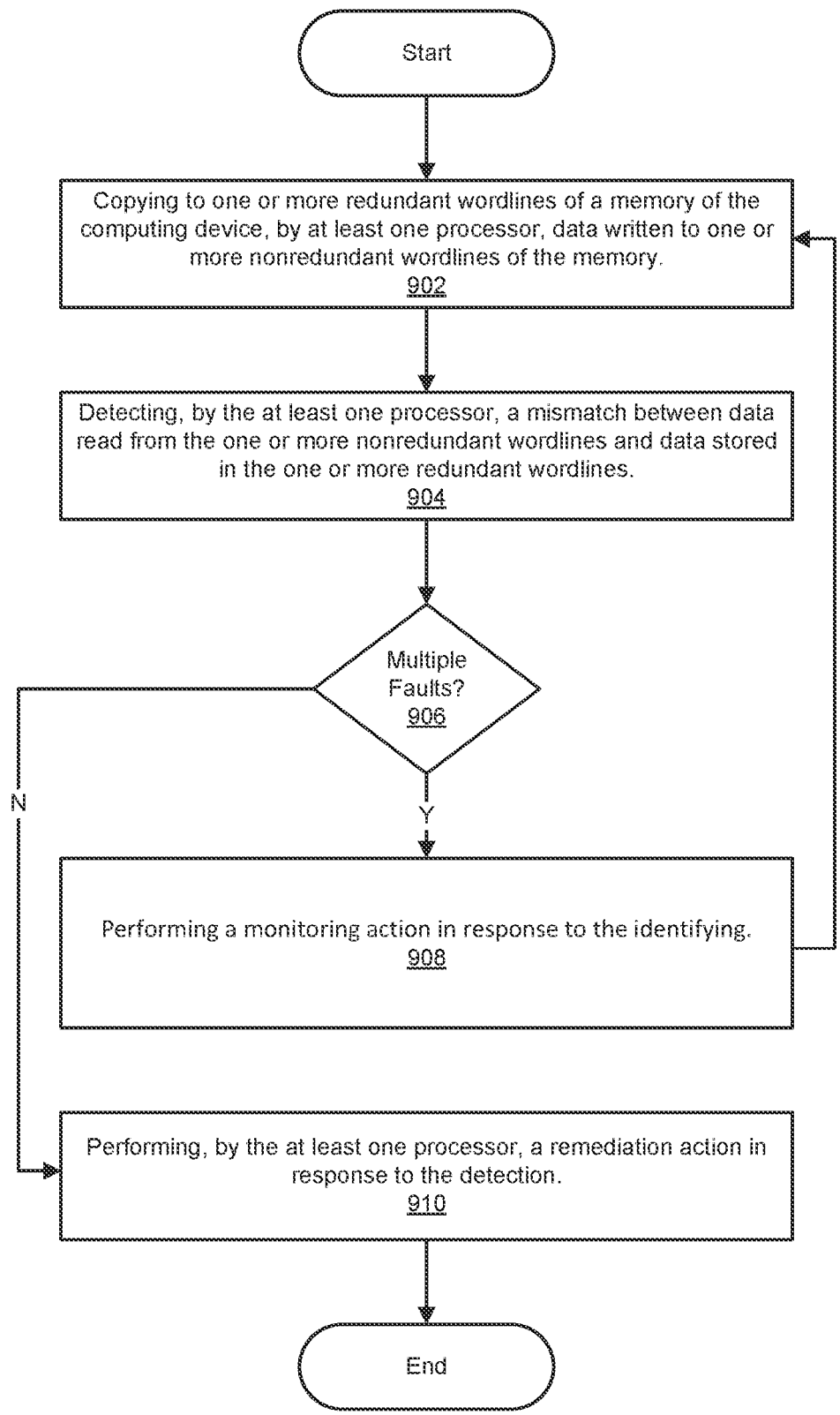
FIG. 9 is a flow diagram of an example method for continuous wordline monitoring with an example removal from service of a redundant wordline.

FIG. 9 is a flow diagram of an example computer-implemented method 900 for continuous wordline monitoring with reassignment of a redundant wordline to monitor a different nonredundant wordline. The steps shown in FIG. 9 are performed by any suitable computer-executable code and/or computing system, including system 100 in FIG. 1, system 200 in FIG. 2, and/or variations or combinations of one or more of the same. In one example, each of the steps shown in FIG. 9 represent an algorithm whose structure includes and/or is represented by multiple sub-steps, examples of which will be provided in greater detail below.

Method 900 includes steps 902, 904, and 910, examples of which perform one or more operations as described above with reference, respectively, to steps 302, 304, and 306 of FIG. 3. In some examples, step 910 additionally includes recording information in monitoring criteria 102E such as by setting a flag and/or incrementing a count recording a number of times a redundant wordline was used to detect a mismatch. In some of these examples, step 910 also includes resetting the flag and/or the count in response to data being read and compared without resulting in detection of a mismatch. Further, method 900 includes steps 906 and 908, example operations of which accomplish removal from service of a redundant wordline.

At step 906 one or more of the systems described herein identifies multiple faults. For example, other module(s) 110, as part of computing device 202 in FIG. 2, identify, by the at least one processor, multiple faults using a redundant wordline of the one or more redundant wordlines to monitor multiple nonredundant wordlines of the one or more nonredundant wordlines.

In various examples, the systems described herein perform step 906 in a variety of ways. In one example, other module(s) 110, as part of computing device 202 in FIG. 2, reassign a redundant wordline to monitor a different nonredundant wordline in response to removal of a nonredundant wordline from service because of a detected mismatch. This reassignment is performed, for example, in step 904 or step 910. Then, other module(s) 110 identify, at step 906, that another mismatch was detected at step 904 while monitoring the different nonredundant wordline.

At step 908 one or more of the systems described herein performs a monitoring action. For example, other module(s) 110, as part of computing device 202 in FIG. 2, perform the monitoring action in response to the identifying.

In various examples, the systems described herein perform step 906 in a variety of ways. In some examples, other module(s) 110, as part of computing device 202 in FIG. 2, perform the monitoring action by taking the redundant wordline out of service. In some of these examples, other module(s) 110, as part of computing device 202 in FIG. 2, perform the monitoring action by returning to service the nonredundant wordline that was removed from service in response to detecting the mismatch using the redundant wordline that was removed from service. In some of these examples, other module(s) 110, as part of computing device 202 in FIG. 2, perform the monitoring action by using one or more different redundant wordlines to monitor the multiple nonredundant wordlines. If the monitoring of the nonredundant wordlines with the different redundant wordlines confirms both are faulty at step 904, then other module(s) 110, as part of computing device 202 in FIG. 2, perform the monitoring action by returning the redundant wordline to service and removing the nonredundant wordlines from service. In contrast, if the monitoring of the nonredundant wordlines with the different redundant wordlines confirms both are not faulty, other module(s) 110, as part of computing device 202 in FIG. 2, perform the monitoring action by returning to service, as a redundant wordline, at least one previously reassigned redundant wordline that was previously reassigned as a nonredundant wordline (e.g., in place of the nonredundant wordline that was returned to service).

Figure 10:
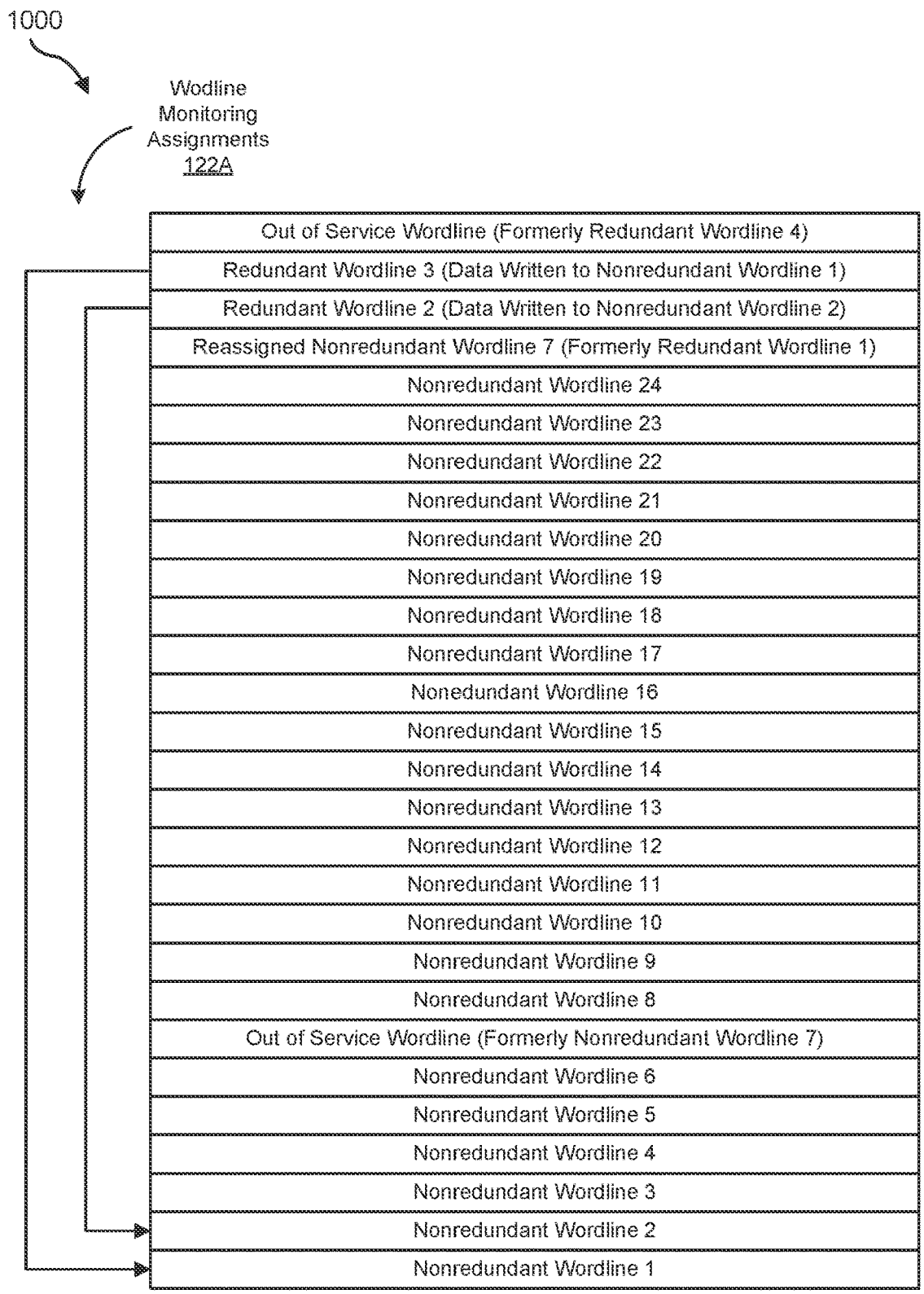
FIG. 10 is a block diagram illustrating an example removal from service of a redundant wordline with reference to the example set of wordlines of the memory of the computing device.

FIG. 10 illustrates an example application of the method of FIG. 9 to a set of wordlines 1000. For example, FIG. 10 demonstrates removal of a redundant wordline from service in response to two sequential mismatches on two separate nonredundant wordlines. Additionally, FIG. 10 demonstrates return to service of a nonredundant wordline that had been removed from service. Also, FIG. 10 demonstrates wordline monitoring assignments 122A that are modified to reassign a pair of redundant wordlines to monitor the two separate nonredundant wordlines. The state of the wordlines 800 reflects application of an example of steps 902-908 of method 900 of FIG. 9.

Figure 11:
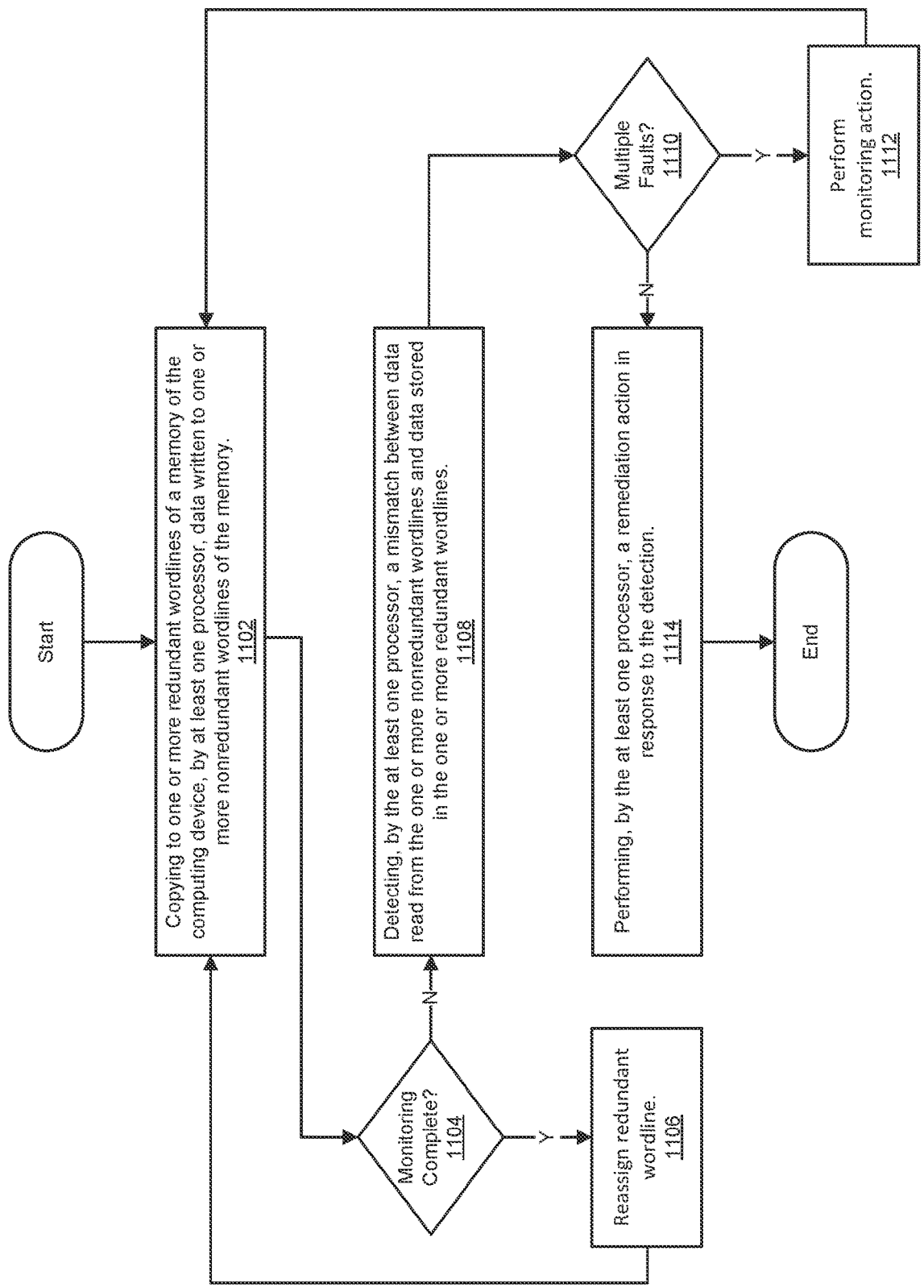
FIG. 11 is a flow diagram of an example method for continuous wordline monitoring with an example reassignment of a redundant wordline to monitor a different nonredundant wordline and an example removal from service of a redundant wordline.

FIG. 11 is a flow diagram of an example computer-implemented method 1100 for continuous wordline monitoring with reassignment of redundant wordlines and removal from service of redundant wordlines. The steps shown in FIG. 11 are performed by any suitable computer-executable code and/or computing system, including system 100 in FIG. 1, system 200 in FIG. 2, and/or variations or combinations of one or more of the same. In one example, each of the steps shown in FIG. 11 represent an algorithm whose structure includes and/or is represented by multiple sub-steps, examples of which will be provided in greater detail below.

Method 1100 includes steps 1102, 1108, and 1114, examples of which perform one or more operations as described above with reference, respectively, to steps 302, 304, and 306 of FIG. 3, steps 702, 708, and 710 of FIG. 7, and steps 902, 904, and 910 of FIG. 9. Method 1100 additionally includes steps 1104 and 1106, examples of which perform one or more operations as described above with reference, respectively, to steps 704 and 706 of FIG. 7. Method 1100 also includes steps 1110 and 1112, examples of which perform one or more operations as described above with reference, respectively, to steps 906 and 908 of FIG. 9. Further, since redundant wordlines are reassigned to monitor different nonredundant wordlines in various situations, some examples of step 1110 use a flag and/or count for a redundant wordline to track a number of consecutive fault detections accomplished using that redundant wordline, and some examples of step 1104 reset this flag and/or count when monitoring for a nonredundant wordline is completed. Thus, a number (e.g., two) of consecutive fault detections accomplished using a particular redundant wordline for different non-redundant wordlines serves as a threshold condition for identifying multiple faults at step 1110.

In the above examples of the sets of wordlines, the redundant wordlines are treated as being capable of repairing and/or monitoring any of the nonredundant wordlines. However, in some examples, the memory array is organized into wordline groups, (e.g., subarrays, units, blocks, etc.), with each group having few or only one redundant element that is capable of being used to repair nonredundant wordlines in that group. In some of these examples, the wordlines of a group are able to be assigned to monitor nonredundant wordlines of other groups, but in other examples the redundant elements are not able to monitor wordlines outside of their respective groups. In many of these examples, monitoring and repair are performed on a group basis and, once the redundant element(s) have all been used for repair or have been taken out of service, the continuous wordline monitoring for that group is no longer performed, even though it continues for other groups. In some examples, if redundant wordlines are useful for monitoring, but not repairing, other groups, then the continuous monitoring of a group continues even after all of its redundant elements have been used for repair or taken out of service. In some examples, if a fault is detected in a wordline of a group by the monitoring or by ECC, and if there are no remaining redundant elements useful for repairing the defective wordline in that group, then the group is taken out of service.

As detailed above, the present disclosure details systems and methods that perform continuous wordline monitoring. For example, unused redundant elements are activated in a monitoring mode, recording nonredundant wordline writes to a redundant wordline. When reads to the nonredundant wordline are observed, the redundant element is also read, and the results from the redundant element and the nonredundant element are compared. If a difference is found, this represents a possible wordline fault. For example, if more than two bits differ, double-error-detect ECC codes cannot reliably discover the fault, and the machine is halted to prevent further corruption.

In some examples, monitoring for the entire memory array is provided by causing the redundant element to move incrementally from wordline to wordline over the course of time, monitoring each in turn for faults. This sweep is simple to implement and is accomplished almost entirely using existing hardware and storage that a memory array vulnerable to wordline faults is likely to already have, namely wordline repair features. As a result, the monitoring leverages existing hardware that is often included but frequently unused. In some examples, the continuous wordline monitoring is added upon the detection capability of ECC, and the data storage is already provisioned for memory array repair capabilities. Thus, detection of large faults is improved for a low cost.

While the foregoing disclosure sets forth various embodiments using specific block diagrams, flowcharts, and examples, each block diagram component, flowchart step, operation, and/or component described and/or illustrated herein is implemented, individually and/or collectively, using a wide range of hardware, software, or firmware (or any combination thereof) configurations. In addition, any disclosure of components contained within other components should be considered example in nature since many other architectures are often implemented to achieve the same functionality.

In some examples, all or a portion of example system 100 in FIG. 1 represent portions of a cloud-computing or network-based environment. Cloud-computing environments provide various services and applications via the Internet. These cloud-based services (e.g., software as a service, platform as a service, infrastructure as a service, etc.) are accessible through a web browser or other remote interface. Various functions described herein are provided through a remote desktop environment or any other cloud-based computing environment.

In various embodiments, all or a portion of example system 100 in FIG. 1 facilitate multi-tenancy within a cloud-based computing environment. In other words, the modules described herein configure a computing system (e.g., a server) to facilitate multi-tenancy for one or more of the functions described herein. For example, one or more of the modules described herein program a server to enable two or more clients (e.g., customers) to share an application that is running on the server. A server programmed in this manner shares an application, operating system, processing system, and/or storage system among multiple customers (i.e., tenants). One or more of the modules described herein also partitions data and/or configuration information of a multi-tenant application for each customer such that one customer cannot access data and/or configuration information of another customer.

According to various embodiments, all or a portion of example system 100 in FIG. 1 is implemented within a virtual environment. For example, the modules and/or data described herein reside and/or execute within a virtual machine. As used herein, the term "virtual machine" generally refers to any operating system environment that is abstracted from computing hardware by a virtual machine manager (e.g., a hypervisor).

In some examples, all or a portion of example system 100 in FIG. 1 represent portions of a mobile computing environment. Mobile computing environments are implemented by a wide range of mobile computing devices, including mobile phones, tablet computers, e-book readers, personal digital assistants, wearable computing devices (e.g., computing devices with a head-mounted display, smartwatches, etc.), variations or combinations of one or more of the same, or any other suitable mobile computing devices. In some examples, mobile computing environments have one or more distinct features, including, for example, reliance on battery power, presenting only one foreground application at any given time, remote management features, touchscreen features, location and movement data (e.g., provided by Global Positioning Systems, gyroscopes, accelerometers, etc.), restricted platforms that restrict modifications to system-level configurations and/or that limit the ability of third-party software to inspect the behavior of other applications, controls to restrict the installation of applications (e.g., to only originate from approved application stores), etc. Various functions described herein are provided for a mobile computing environment and/or interact with a mobile computing environment.

The process parameters and sequence of steps described and/or illustrated herein are given by way of example only and variable as desired. For example, while the steps illustrated and/or described herein are shown or discussed in a particular order, these steps do not necessarily need to be performed in the order illustrated or discussed. The various example methods described and/or illustrated herein also omit one or more of the steps described or illustrated herein or include additional steps in addition to those disclosed.

While various embodiments have been described and/or illustrated herein in the context of fully functional computing systems, one or more of these example embodiments are distributed as a program product in a variety of forms, regardless of the particular type of computer-readable media used to actually carry out the distribution. The embodiments disclosed herein are also implemented using modules that perform certain tasks. These modules include script, batch, or other executable files that are stored on a computer-readable storage medium or in a computing system. In some embodiments, these modules configure a computing system to perform one or more of the example embodiments disclosed herein.

The preceding description has been provided to enable others skilled in the art to best utilize various aspects of the example embodiments disclosed herein. This example description is not intended to be exhaustive or to be limited to any precise form disclosed. Many modifications and variations are possible without departing from the spirit and scope of the present disclosure. The embodiments disclosed herein should be considered in all respects illustrative and not restrictive. Reference should be made to the appended claims and their equivalents in determining the scope of the present disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. A computing device comprising:
 a cache memory; and
 at least one processor coupled to the cache memory, wherein the at least one processor is configured to:
  copy data written to one or more nonredundant wordlines of the cache memory to one or more redundant wordlines of the cache memory;
  detect a mismatch between data read from the one or more nonredundant wordlines and data stored in the one or more redundant wordlines; and
  perform a remediation action in response to detecting the mismatch.

2. The computing device of claim 1, wherein the at least one processor is further configured to:
 identify a wordline fault in a nonredundant wordline of the one or more nonredundant wordlines.

3. The computing device of claim 1, wherein the remediation action corresponds to halting operation of the computing device.

4. The computing device of claim 1, wherein the remediation action corresponds to repairing the cache memory by taking a nonredundant wordline of the one or more nonredundant wordlines out of service and reassigning a redundant wordline of the redundant wordlines in place of the nonredundant wordline.

5. The computing device of claim 1, wherein the at least one processor is further configured to:
 identify multiple faults using a redundant wordline of the one or more nonredundant wordlines to monitor multiple nonredundant wordlines of the one or more nonredundant wordlines.

6. The computing device of claim 5, wherein the at least one processor is further configured to:
 perform a monitoring action in response to the identifying, wherein the monitoring action corresponds to at least one of:
  taking the redundant wordline out of service in response to the identifying;
  using at least one different redundant wordline of the redundant wordlines to monitor the multiple nonredundant wordlines;
  returning to service at least one nonredundant wordline of the multiple nonredundant wordlines; or
  returning to service, as a redundant wordline, at least one previously reassigned redundant wordline that was previously reassigned as a nonredundant wordline.

7. The computing device of claim 1, wherein the at least one processor is further configured to:
 identify that monitoring of a nonredundant wordline of the one or more nonredundant wordlines is complete.

8. The computing device of claim 7, wherein the at least one processor is further configured to:
 reassign, in response to the identification, a redundant wordline of the one or more redundant wordlines to monitor a different nonredundant wordline of the of the one or more nonredundant wordlines.

9. The computing device of claim 7, wherein the at least one processor is configured to identify that monitoring of the nonredundant wordline is complete at least in part by identifying that at least one of:
 the read data matches the stored data;
 a predetermined monitoring duration has expired; or
 a predetermined number of accesses has occurred.

10. A system for continuous wordline monitoring, the system comprising:

at least one physical processor;

physical memory comprising computer-executable instructions that, when executed by the physical processor, cause the physical processor to:

copy, to one or more redundant wordlines of a memory of a computing device, data written to one or more nonredundant wordlines of the memory;

detect a mismatch between data read from the one or more nonredundant wordlines and data stored in the one or more redundant wordlines; and perform a remediation action in response to detecting the mismatch.

11. The system of claim 10, wherein the computer-executable instructions further cause the physical processor to:

identify, in response to the detection, a wordline fault in a nonredundant wordline of the one or more nonredundant wordlines.

12. The system of claim 10, wherein the remediation action corresponds to halting operation of the computing device.

13. The system of claim 10, wherein the remediation action corresponds to repairing the memory by taking a nonredundant wordline of the one or more nonredundant wordlines out of service and reassigning a redundant wordline of the redundant wordlines in place of the nonredundant wordline.

14. The system of claim 10, wherein the computer-executable instructions further cause the physical processor to:

identify multiple faults using a redundant wordline of the one or more redundant wordlines to monitor multiple nonredundant wordlines of the one or more nonredundant wordlines.

15. The system of claim 14, wherein the computer-executable instructions further cause the physical processor to:

perform a monitoring action in response to the identifying, wherein the monitoring action corresponds to at least one of:

taking the redundant wordline out of service in response to the identifying;

using at least one different redundant wordline of the redundant wordlines to monitor the multiple nonredundant wordlines;

returning to service at least one nonredundant wordline of the multiple nonredundant wordlines; or returning to service, as a redundant wordline, at least one previously reassigned redundant wordline that was previously reassigned as a nonredundant wordline.

16. The system of claim 10, wherein the computer-executable instructions further cause the physical processor to:

identify that monitoring of a nonredundant wordline of the one or more nonredundant wordlines is complete.

17. The system of claim 16, wherein the computer-executable instructions further cause the physical processor to:

reassign, in response to the identification, a redundant wordline of the one or more redundant wordlines to monitor a different nonredundant wordline of the of the one or more nonredundant wordlines.

18. The system of claim 16, wherein identifying that monitoring of the nonredundant wordline is complete includes identifying that at least one of:

the read data matches the stored data;

a predetermined monitoring duration has expired; or a predetermined number of accesses has occurred.

19. A computer-implemented method for continuous wordline monitoring, at least a portion of the method being performed by a computing device comprising at least one processor, the method comprising:

copying, by the at least one processor, data written to one or more nonredundant wordlines of a memory of the computing device to one or more redundant wordlines of the memory of the computing device;

detecting, by the at least one processor, a mismatch between data read from the one or more nonredundant wordlines and data stored in the one or more redundant wordlines; and performing, by the at least one processor, a remediation action in response to detecting the mismatch.

20. The method of claim 19, further comprising:

identifying, by the at least one processor in response to the detection, a wordline fault in a nonredundant wordline of the one or more nonredundant wordlines.

* * * * *